US012406382B2

(12) United States Patent
Xiong et al.

(10) Patent No.: US 12,406,382 B2
(45) Date of Patent: Sep. 2, 2025

(54) METHOD FOR VIRTUAL PRE-ASSEMBLY MATCHING OF PREFABRICATED BEAMS BASED ON DESIGN-MEASURED POINT CLOUD MODELS

(71) Applicant: Southeast University, Jiangsu (CN)

(72) Inventors: Wen Xiong, Nanjing (CN); Chang Xu, Nanjing (CN); Yanjie Zhu, Nanjing (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 0 days.

(21) Appl. No.: 18/256,266

(22) PCT Filed: Dec. 28, 2022

(86) PCT No.: PCT/CN2022/142697
§ 371 (c)(1),
(2) Date: Jun. 7, 2023

(87) PCT Pub. No.: WO2023/226429
PCT Pub. Date: Nov. 30, 2023

(65) Prior Publication Data
US 2025/0218008 A1    Jul. 3, 2025

(30) Foreign Application Priority Data
May 24, 2022   (CN) .......................... 202210570841.0

(51) Int. Cl.
*G06T 7/33*     (2017.01)
*G06T 3/14*     (2024.01)
*G06T 5/70*     (2024.01)

(52) U.S. Cl.
CPC ............... *G06T 7/344* (2017.01); *G06T 3/14* (2024.01); *G06T 5/70* (2024.01); *G06T 2207/10028* (2013.01)

(58) Field of Classification Search
CPC .. G06T 7/344; G06T 3/14; G06T 5/70; G06T 7/30; G06T 2207/10028
See application file for complete search history.

(56) References Cited

U.S. PATENT DOCUMENTS

2021/0174604 A1*  6/2021  Long ...................... G06T 19/20

FOREIGN PATENT DOCUMENTS

| CN | 110060338 A |   | 7/2019 |             |
|----|-------------|---|--------|-------------|
| CN | 107123164 B | * | 4/2020 | G06T 19/20  |

(Continued)

OTHER PUBLICATIONS

Cherifi, Dalila, et al. "3D shape modelling of femur." 2016 International Conference on Bio-engineering for Smart Technologies (BioSMART). IEEE, 2016. (Year: 2016).*

(Continued)

*Primary Examiner* — Henok Shiferaw
*Assistant Examiner* — Toluwani Mary-Jane Ijaseun
(74) *Attorney, Agent, or Firm* — Muncy, Geissler, Olds & Lowe, P.C.

(57) ABSTRACT

The present invention relates to the field of virtual pre-assembly matching of bridge engineering components based on 3D point clouds, and particularly relates to a method for virtual pre-assembly matching of prefabricated beams based on design-measured point cloud models. An oriented bounding box is computed respectively for 3D point clouds of two prefabricated beams with assembly relationship therebetween, and two point cloud slices and design point cloud are formed; the two point cloud slices are respectively registered with the generated design point cloud by the iterative closest point algorithm; boundary features and corner features of a pre-assembly interface of two components to be assembled are fitted and extracted; and coarse matching and fine matching of the assembly interface are achieved by the (Continued)

Procrustes analysis algorithm and the iterative closest point algorithm in sequence, a matching degree error of the interface is computed, and an assembly result is evaluated.

5 Claims, 4 Drawing Sheets

(56) References Cited

FOREIGN PATENT DOCUMENTS

| | | | | |
|---|---|---|---|---|
| CN | 111369607 A | | 7/2020 | |
| CN | 113935082 A | * | 1/2022 | ............. G06T 17/10 |
| CN | 114972457 A | | 8/2022 | |

OTHER PUBLICATIONS

Yuan, Chi, Xiaoqing Yu, and Ziyue Luo. "3D point cloud matching based on principal component analysis and iterative closest point algorithm." 2016 International conference on audio, language and image processing (ICALIP). IEEE, 2016. (Year: 2016).*

* cited by examiner

METHOD FOR VIRTUAL PRE-ASSEMBLY MATCHING OF PREFABRICATED BEAMS BASED ON DESIGN-MEASURED POINT CLOUD MODELS

TECHNICAL FIELD

The present invention relates to the field of virtual pre-assembly matching of bridge engineering components based on 3D point clouds, and particularly relates to a method for virtual pre-assembly matching of prefabricated beams based on design-measured point cloud models.

BACKGROUND

The 3D laser scanning technology can directly and quickly obtain massive 3D coordinate data of target surfaces, and has the advantages of high measurement efficiency, high degree of automation, low work intensity of inspectors, large amount of data, and high data processing efficiency, and the like. Compared with traditional measurement technologies, it has broader application prospects. The 3D point cloud data collected by a 3D laser scanner can present point coordinate information of a surface of a measured object in a form of a 3D point cloud, which is not only intuitive and easy to read, but also breaks through traditional single-point detection. Based on the above advantages, the 3D laser scanning technology and 3D point clouds are more and more applied in the field of bridge engineering to achieve the manufacturing quality inspection of prefabricated components, construction monitoring, and structure health monitoring by identifying geometric features of the components in the 3D point clouds. However, it is urgent to solve how to quickly identify required features from a point cloud containing massive 3D coordinate information, how to achieve the virtual pre-assembly matching of prefabricated beams based on a 3D point cloud, and how to achieve accurate fitting in the face of complex geometric features, so as to improve the computational efficiency and the degree of automation.

SUMMARY

For 3D point clouds of bridge engineering components, the present invention provides a method for virtual pre-assembly matching of prefabricated beams based on the iterative closest point algorithm, the Procrustes analysis algorithm and the feature fitting algorithm, which is easy to implement by programming, thereby improving the computation efficiency and the degree of automation compared with the traditional methods.

The present invention adopts the following technical solutions:

the method for virtual pre-assembly matching of prefabricated beams based on design-measured point cloud models according to the present invention includes the following steps:

step (1): computing an oriented bounding box respectively for 3D point clouds of two prefabricated beams with assembly relationship therebetween, and implementing 3D coordinate calibration based on geometric features of the 3D point clouds of the two prefabricated beams; for the calibrated 3D point clouds of the two prefabricated beams, making two point cloud slices at the assembly interface of the two prefabricated beams respectively; and based on an assembly interface jointly contained in the two point cloud slices, generating a discrete design point cloud for design information contained in the assembly interface;

step (2): registering the point cloud slices at the assembly interface of the two prefabricated beams in step (1) with the generated design point cloud respectively by means of the iterative closest point algorithm; and setting a distance threshold on the basis of a coordinate range of the design point cloud to denoise the two point cloud slices at the assembly interface;

step (3): based on the coordinate range of the design point cloud in step (2), partitioning the two denoised point cloud slices; and selecting a fitting function and a fitting algorithm according to features required to be fitted, to fit and extract boundary features and corner features of an assembly interface of two components to be assembled; and step (4): based on the fitted boundary features and corner features of the pre-assembly interface of the two components to be assembled in step (3), implementing coarse matching of the assembly interface by means of the Procrustes analysis algorithm firstly, and then implementing fine matching of the assembly interface by means of the iterative closest point algorithm, adjusting the point cloud to be in a final assembly posture, computing a matching degree error of the assembly interface, and evaluating the assembly result.

In the method for virtual pre-assembly matching of prefabricated beams based on design-measured point cloud models according to claim 1, step (1) comprises the following specific sub-steps:

step 1.1: computing an oriented bounding box respectively for 3D point clouds of two prefabricated beams with assembly relationship therebetween, such that the X-axis, Y-axis and z-axis directions of a 3D coordinate system are respectively parallel to the beam width, beam length and beam height directions of a component, thereby achieving coordinate calibration;

step 1.2: for features of an assembly interface of the two prefabricated beams, making point cloud slices (i.e., a sliced point cloud $P_1$ and a sliced point cloud $Q_1$) parallel to a XOZ coordinate plane respectively at an assembly interface of the two 3D point clouds subjected to coordinate calibration;

where the thickness of the slice is twice the density of a measured point cloud; and the expression is as follows:

$$P_1=\{p_1,p_2,\ldots,p_m\}, Q_1=\{q_1,q_2,\ldots,q_n\}$$

step 1.3: generating a discrete design point cloud D based on design information and design drawings of an assembly interface jointly contained in the sliced point cloud $P_1$ and the sliced point cloud $Q_1$, where the expression is as follows:

$$D=\{d_1,d_2,\ldots,d_j\}$$

In the method for virtual pre-assembly matching of prefabricated beams based on design-measured point cloud models according to the present invention, in step (2), by taking the design point cloud D as a reference, the sliced point cloud $P_1$ and the sliced point cloud $Q_1$ are respectively registered with the design point cloud D based on the iterative closest point algorithm through a registration method as follows:

step 2.1: moving centroids of the sliced point cloud $P_1$, the sliced point cloud $Q_1$ and the design point cloud D respectively to an origin of coordinates, that is:

$$P_c = P_1 - \overline{P_1}, \ Q_c = Q_1 - \overline{Q_1}, \ D_c = D - \overline{D}$$

where $P_c$ is the moved sliced point cloud $P_1$, and $\overline{P_1}$ is an average value of coordinates of the sliced point cloud $P_1$;

$Q_c$ is the moved sliced point cloud $Q_1$, and $\overline{Q_1}$ is an average value of coordinates of the sliced point cloud $Q_1$; and $D_c$ is the moved design point cloud $D_c$, and $\overline{D}$ is an average value of coordinates of the design point cloud D;

step 2.2: in the moved design point cloud $D_c$, finding points closest to each point in the moved sliced point cloud $P_c$ and the moved sliced point cloud $Q_c$ respectively, and minimizing a variance of a distance between corresponding points via an orthogonal rotation matrix and a rigid translation matrix, that is:

$$\operatorname{argmin}(f(p)) = \frac{1}{m}\sum_{i=1}^{m} \| R_p \cdot p_i + T_p - d_i \|^2$$

$$\operatorname{argmin}(f(q)) = \frac{1}{n}\sum_{i=1}^{n} \| R_q \cdot q_i + T_q - d_i \|^2$$

where m is the number of points of the moved sliced point cloud $P_c$, n is the number of points of the moved sliced point cloud $Q_c$, and $p_i$ is an i-th point in the moved sliced point cloud $P_c$, $q_i$ is an i-th point in the moved sliced point cloud $Q_c$, and $d_i$ is an i-th point in the moved design point cloud $D_c$;

computing an orthogonal rotation matrix $R_p$ and a rigid translation matrix $T_p$ based on the above equation when the moved sliced point cloud $P_c$ is registered with the moved design point cloud $D_c$; and computing an orthogonal rotation matrix $R_q$ and a rigid translation matrix $T_q$ based on the above equation when the moved sliced point cloud $Q_c$ is registered with the moved design point cloud $D_c$; and obtaining a sliced point cloud $P_2$ and a sliced point cloud $Q_2$ after registration with an expression as follows:

$$P_2 = R_p \cdot P_c + T_p$$
$$Q_2 = R_q \cdot Q_c + T_q$$

step 2.3: based on the coordinates of the design point cloud D, setting a distance threshold, screening valid point clouds, regarding points beyond a coordinate range in the point clouds $P_2$ and $Q_2$ as invalid points and removing them to obtain a denoised sliced point cloud $P_3$ and a denoised sliced point cloud $Q_3$.

In the method for virtual pre-assembly matching of prefabricated beams based on design-measured point cloud models according to the present invention, step (3) comprises the following specific sub-steps:

step 3.1: based on the coordinates of the design point cloud $D_c$, partitioning the denoised sliced point cloud $P_3$ and the denoised sliced point cloud $Q_3$, and extracting boundary features and corner features respectively; and step 3.2: for the boundary features, directly fitting using a fitting function or a fitting algorithm; and for the corner features, fitting the boundary features firstly and then computing intersection points by intersecting the boundary features, and when a point corresponding to a corner feature obtained by fitting cannot be found in a measured point cloud, selecting a closest point as the corner feature by means of the nearest neighbor search method.

In the method for virtual pre-assembly matching of prefabricated beams based on design-measured point cloud models according to the present invention, in step (4), computing a matching degree error of the interface and evaluating an assembly result are specifically implemented as follows:

step 4.1: based on 3D coordinate information of the corner features extracted from the denoised sliced point cloud $P_3$ and the denoised sliced point cloud $Q_3$, establishing a pre-assembly point set $C_P$ and a pre-assembly point set $C_Q$, where both $C_P$ and $C_Q$ are k*3 matrices, and k is the number of matching points;

$$C_P = \{C_{P1}, C_{P2}, \ldots, C_{Pk}\}, C_Q = \{C_{Q1}, C_{Q2}, \ldots, C_{Qk}\}$$

step 4.2: based on the Procrustes analysis algorithm, and by taking the pre-assembly point set $C_P$ as a reference, aligning the pre-assembly point set $C_Q$ with the pre-assembly point set $C_P$, where the expression is as follows:

$$C_Q = R_c \cdot C_P + T_c + E_c$$

computing an orthogonal rotation matrix $R_c$ under coarse matching based on the above equation;

computing a rigid translation matrix $T_c$ under coarse matching based on the above equation;

computing an error matrix $E_c$ under coarse matching based on the above equation;

determining a posture corresponding to the minimum distance between the two matching point sets, namely, determining a posture when the error matrix Ee is minimum under coarse matching as a posture after coarse matching;

$$\operatorname{argmin}\|E_c\|$$

based on the orthogonal rotation matrix $R_c$ under coarse matching and the rigid translation matrix $T_c$ under coarse matching, adjusting the denoised sliced point cloud $Q_3$ to a sliced point cloud $Q_4$ after coarse matching with an expression as follows:

$$Q_4 = R_c \cdot Q_3 + T_c$$

to achieve coarse matching; and step 4.3: based on the iterative closest point algorithm, finding a point in the sliced point cloud $Q_4$ after coarse matching that is closest to each point in the sliced point cloud $P_3$ after denoising, and minimizing a variance of a distance between corresponding points via an orthogonal rotation matrix and a rigid translation matrix, that is:

$$\arg\min \| R_f \cdot Q_4 + T_f - P_3 \|^2$$

computing an orthogonal rotation matrix $R_f$ under fine matching based on the above equation;

computing a rigid translation matrix $T_f$ under fine matching based on the above equation;

based on the orthogonal rotation matrix $R_f$ under fine matching and the rigid translation matrix $T_f$ under fine matching, adjusting the sliced point cloud $Q_4$ to a final assembly posture point cloud $Q_{final}$ with an expression as follows:

$$Q_{final} = R_f \cdot Q_4 + T_f$$

to achieve fine matching; and for uniform description, defining the final assembly posture point cloud $P_{final}$ as:

$$P_{final} = P_3$$

step 4.4: in an assembly plane, computing a distance f between each point in the final assembly posture point cloud $Q_{final}$ and its closest point in the final assembly posture point cloud $P_{final}$:

$$f = \| q_{fi} - p_{fi} \|$$

where $P_{fi}$ is an i-th point in the final assembly posture point cloud $P_{final}$ and $q_{fi}$ is an i-th point in the final assembly posture point cloud $Q_{final}$, thereby evaluating an assembly result.

Beneficial Effects

In the method for virtual pre-assembly matching of prefabricated beams based on design-measured point cloud models provided by the present invention, firstly, an oriented bounding box is computed respectively for 3D point clouds of two prefabricated beams with assembly relationship therebetween, and two point cloud slices and design point cloud are generated; secondly, the two point cloud slices are respectively registered with the generated design point cloud by means of the iterative closest point algorithm, and the screening and denoising of the point clouds are achieved based on a distance threshold; then, boundary features and corner features of a pre-assembly interface of two components to be assembled are fitted and extracted; and finally, coarse matching and fine matching of the assembly interface are achieved by means of the Procrustes analysis algorithm and the iterative closest point algorithm in sequence, a matching degree error of the interface is computed and an assembly result is evaluated. According to the method, design point cloud is introduced to achieve the screening of point clouds near features to be extracted, and posture adjustment on components to be assembled is performed by combining a plurality of algorithms, which not only improves the degree of automation and reduces the manual intervention, but also improves the precision of virtual pre-assembly matching and saves the computation time.

DETAILED DESCRIPTION OF THE EMBODIMENTS

Figure 1:
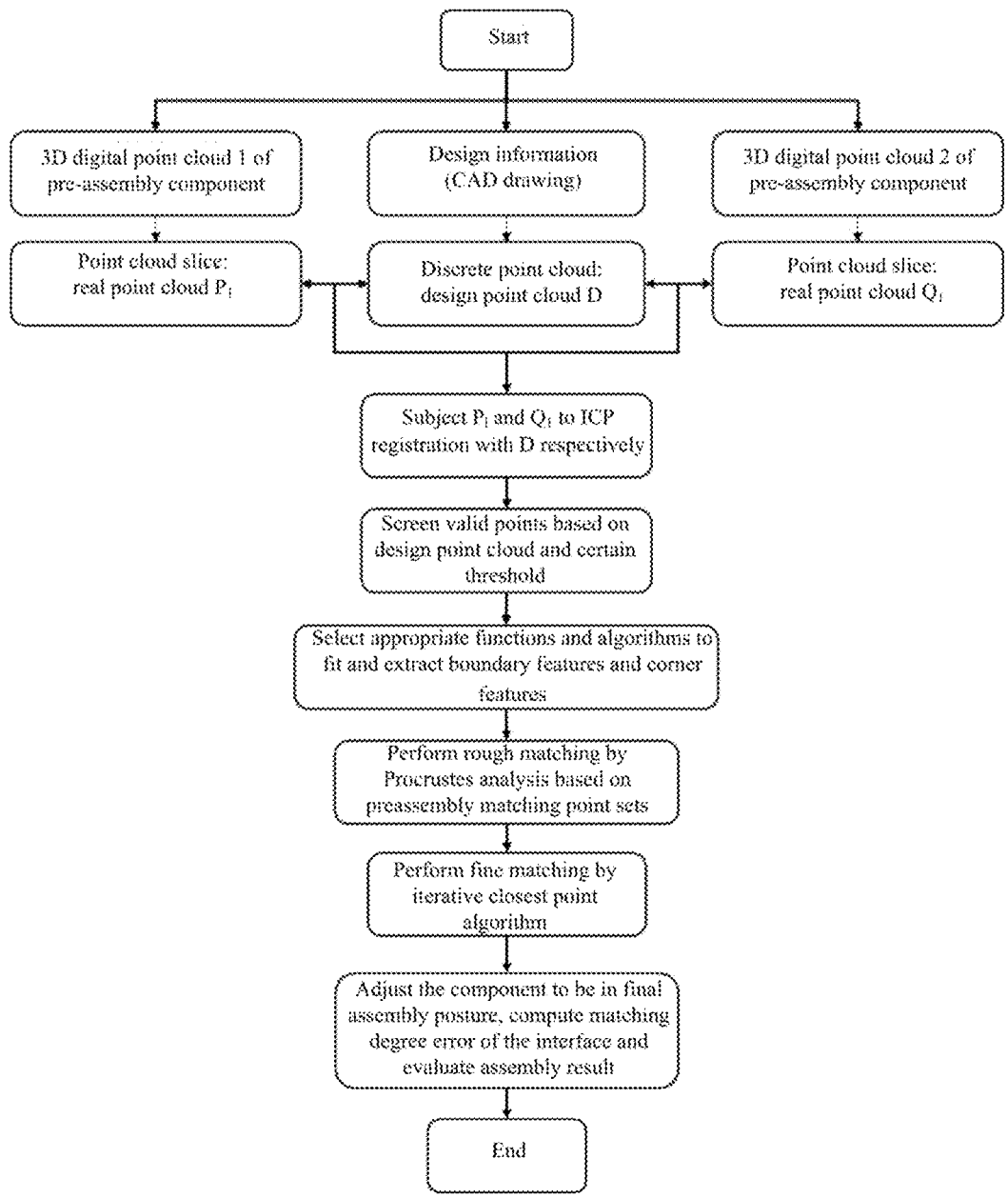
FIG. 1 is a flow chart of a method for virtual pre-assembly matching of prefabricated beams based on design-measured point cloud models according to the present invention.
Figure 2:
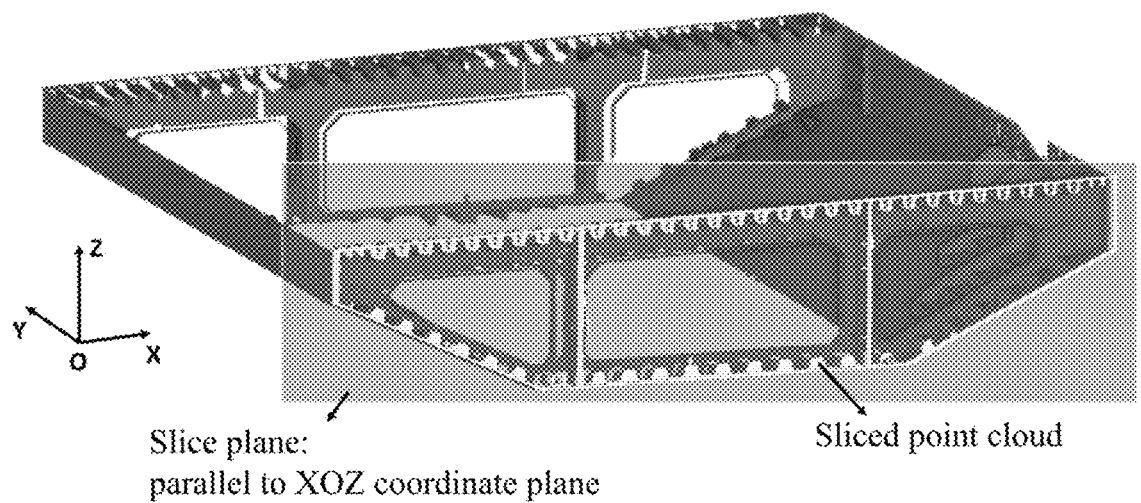
FIG. 2 is a schematic diagram of a point cloud slice in the method for virtual pre-assembly matching of prefabricated beams based on design-measured point cloud models according to the present invention.
Figure 3:
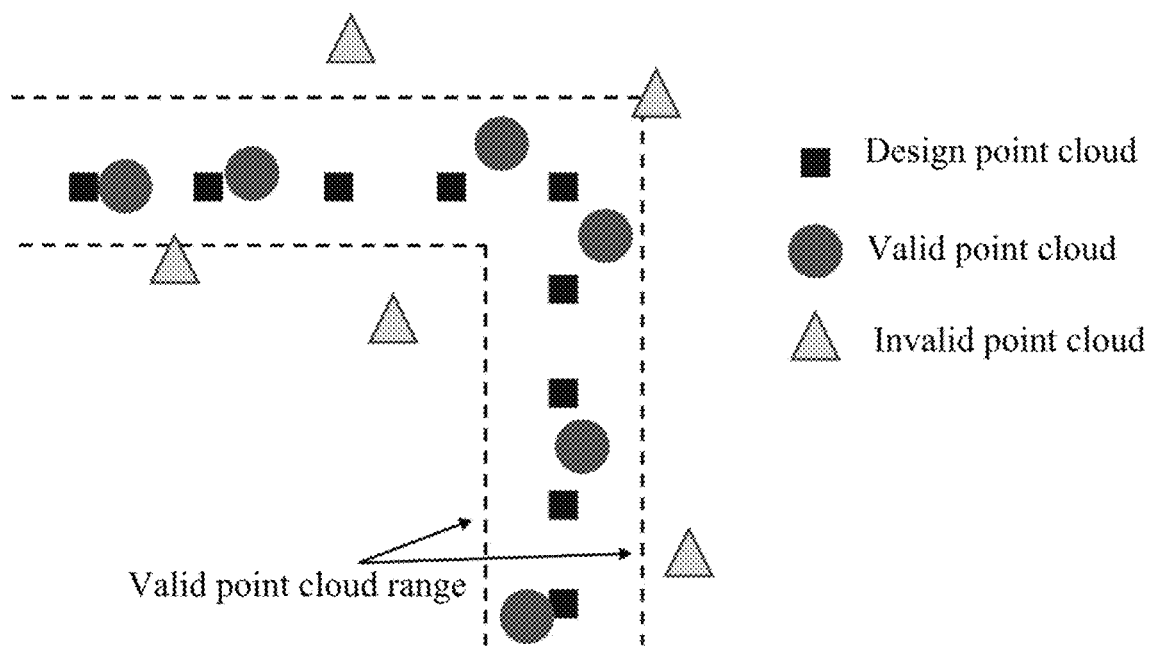
FIG. 3 is a schematic diagram of design-point-cloud and threshold-based valid point cloud screening in the method for virtual pre-assembly matching of prefabricated beams based on design-measured point cloud models according to the present invention.
Figure 4:
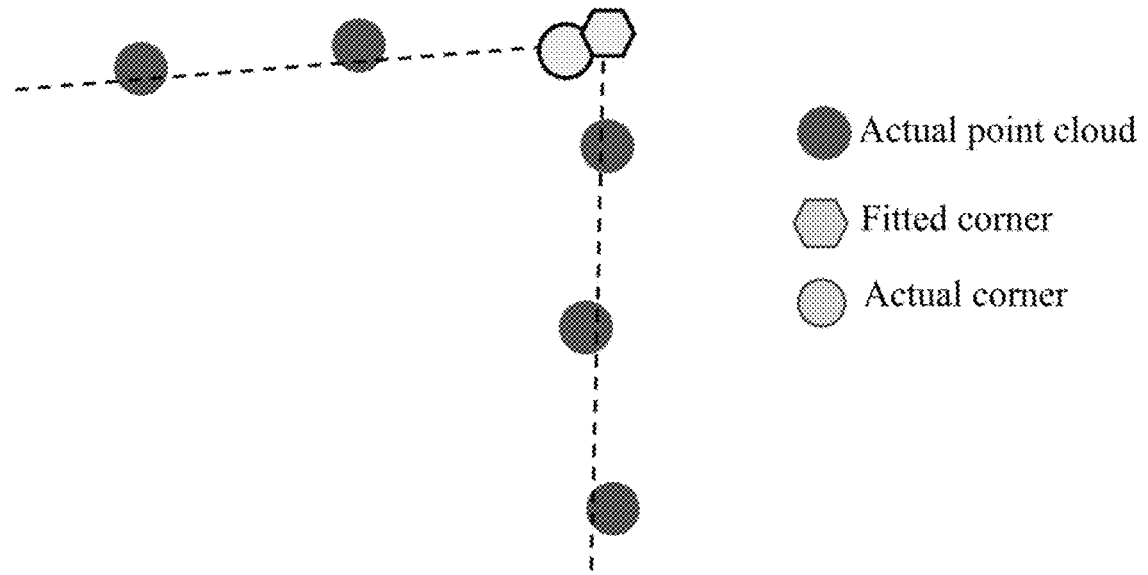
FIG. 4 is a schematic diagram of corner fitting in the method for virtual pre-assembly matching of prefabricated beams based on design-measured point cloud models according to the present invention.
Figure 5:
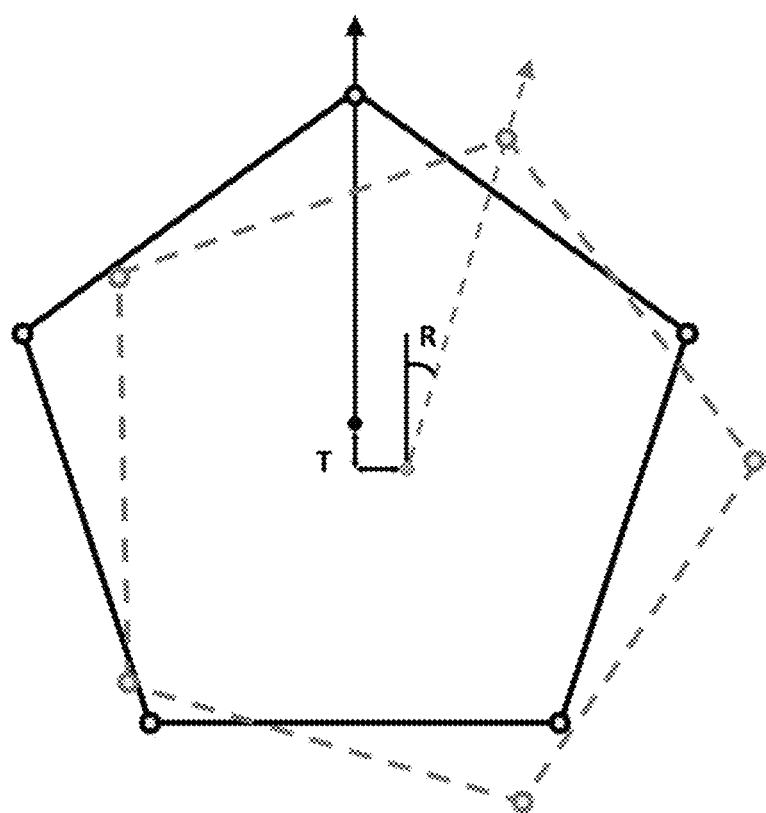
FIG. 5 is a schematic diagram of pre-assembly-matching-point-set-based assembly posture adjustment in the method for virtual pre-assembly matching of prefabricated beams based on design-measured point cloud models according to the present invention.

To make the objectives and technical solutions of embodiments of the present invention clearer, the technical solutions of embodiments of the present invention will be clearly and fully described below with reference to the accompanying drawings of the embodiments of the present invention. Apparently, the described embodiments are merely some rather than all of the embodiments of the present invention. All other embodiments obtained by those of ordinary skill in the art based on the embodiments in the present invention without creative efforts all fall within the scope of protection of the present invention.

As shown in FIGS. 1-5, a method for virtual pre-assembly matching of prefabricated beams based on design-measured point cloud models according to the present invention mainly includes the following steps:

step (1): an oriented bounding box is computed respectively for 3D point clouds of two prefabricated beams with assembly relationship therebetween, and 3D coordinate calibration is implemented based on geometric features of the 3D point clouds of the two prefabricated beams; for the calibrated 3D point clouds of the two prefabricated beams, two point cloud slices are made respectively at an assembly interface of the two prefabricated beams; and based on an assembly interface jointly contained in the two point cloud slices, a discrete design point cloud is generated for design information contained in the assembly interface;

where step (1) includes the following specific sub-steps:

step 1.1: an oriented bounding box is computed respectively for 3D point clouds of two prefabricated beams with assembly relationship therebetween, such that the X-axis, Y-axis and z-axis directions of a 3D coordinate system are respectively parallel to the beam width, beam length and beam height directions of a component, thereby achieving coordinate calibration;

step 1.2: for features of an assembly interface of the two prefabricated beams, point cloud slices (i.e., a sliced point cloud $P_1$ and a sliced point cloud $Q_1$) parallel to a XOZ coordinate plane are made at an assembly interface of the two 3D point clouds subjected to coordinate calibration;

where the thickness of the slice is twice the density of a measured point cloud; and the expression is as follows:

$$P_1=\{p_1,p_2,\ldots,p_m\}, Q_1=\{q_1,q_2,\ldots,q_n\}$$

step 1.3: a discrete design point cloud D is generated based on design information and design drawings of an assembly interface jointly contained in the sliced point cloud $P_1$ and the sliced point cloud $Q_1$, where the point cloud density of the discrete design point cloud needs to be greater than a 3D point cloud density obtained by actual scanning, and generally, is suitably twice a measured point cloud density; and the expression is as follows:

$$D=\{d_1,d_2,\ldots,d_j\}$$

step (2): the point cloud slices at the assembly interface of the two prefabricated beams are registered with the generated design point cloud respectively by means of the iterative closest point algorithm; and a distance threshold is set on the basis of a coordinate range of the design point cloud to denoise the two point cloud slices at the assembly interface;

step 2.1: centroids of the sliced point cloud $P_1$, the sliced point cloud $Q_1$ and the design point cloud D are respectively moved to an origin of coordinates, that is:

$$P_c = P_1 - \overline{P_1},\ Q_c = Q_1 - \overline{Q_1},\ D_c = D - \overline{D}$$

where $P_c$ is the moved sliced point cloud $P_1$, and $\overline{P_1}$ is an average value of coordinates of the sliced point cloud $P_1$;

$Q_c$ is the moved sliced point cloud $Q_1$, and $\overline{Q_1}$ is an average value of coordinates of the sliced point cloud $Q_1$; and $D_c$ is the moved design point cloud D, and $\overline{D}$ is an average value of coordinates of the design point cloud D;

step 2.2: in the moved design point cloud $D_c$, points closest to each point in the moved sliced point cloud $P_c$ and the moved sliced point cloud $Q_c$ are found respectively, and a variance of a distance between corresponding points is minimized via an orthogonal rotation matrix and a rigid translation matrix, that is:

$$\operatorname{argmin}(f(p)) = \frac{1}{m}\sum_{i=1}^{m}\|R_p \cdot p_i + T_p - d_i\|^2$$

$$\operatorname{argmin}(f(q)) = \frac{1}{n}\sum_{i=1}^{n}\|R_q \cdot q_i + T_q - d_i\|^2$$

where m is the number of points of the moved sliced point cloud $P_c$, n is the number of points of the moved sliced point cloud $Q_c$, $p_i$ is an i-th point in the moved sliced point cloud $P_c$, $q_i$ is an i-th point in the moved sliced point cloud $Q_c$, and $d_i$ is an i-th point in the moved design point cloud $D_c$;

an orthogonal rotation matrix $R_p$ and a rigid translation matrix $T_p$ are computed when the moved sliced point cloud $P_c$ is registered with the moved design point cloud $D_c$, and an orthogonal rotation matrix $R_q$ and a rigid translation matrix $T_q$ are computed when the moved sliced point cloud $Q_c$ is registered with the moved design point cloud $D_c$; and a sliced point cloud $P_2$ and a sliced point cloud $Q_2$ are obtained after registration with an expression as follows:

$$P_2 = R_p \cdot P_c + T_p$$

$$Q_2 = R_q \cdot Q_c + T_q$$

step 2.3: based on the coordinates of the design point cloud D, a distance threshold is set, valid point clouds are screened, points beyond a coordinate range in the point clouds $P_2$ and $Q_2$ are regarded as invalid points and removed to obtain a denoised sliced point cloud $P_3$ and a denoised sliced point cloud $Q_3$.

step (3): based on the coordinate range of the design point cloud, the two denoised point cloud slices are partitioned; and a fitting function and a fitting algorithm are selected according to features required to be fitted, to fit and extract boundary features and corner features of an assembly interface of two components to be assembled, which is specifically implemented as follows:

step 3.1: based on the coordinates of the design point cloud $D_c$, the denoised sliced point cloud $P_3$ and the denoised sliced point cloud $Q_3$ are partitioned, and boundary features and corner features are extracted respectively; and step 3.2: for the boundary features, direct fitting using a fitting function or a fitting algorithm is performed; and for the corner features, the boundary features are fitted firstly and then intersection points are computed by intersecting the boundary features, and when a point corresponding to a corner feature obtained by fitting cannot be found in a measured point cloud, a closest point is selected as the corner feature by the nearest neighbor search method;

where the fitting function includes but is not limited to linear equation, parabolic equation, etc., and the fitting algorithm includes but is not limited to least squares method, random sampling consensus algorithm, Hough transform, etc.;

step (4): based on the fitted boundary features and corner features of the pre-assembly interface of the two components to be assembled, coarse matching of the assembly interface is implemented by means of the Procrustes analysis algorithm firstly, and then fine matching of the assembly interface is implemented by means of the iterative closest point algorithm, the point cloud is adjusted to be in a final assembly posture, a matching degree error of the assembly interface is computed, and an assembly result is evaluated.

Step 4.1: based on 3D coordinate information of the corner features extracted from the denoised sliced point cloud $P_3$ and the denoised sliced point cloud $Q_3$, a pre-assembly point set $C_P$ and a pre-assembly point set $C_Q$ are established, where both $C_P$ and $C_Q$ are k*3 matrices, and k is the number of matching points;

$$C_P=\{C_{p1},C_{p2},\ldots,C_{pk}\}, C_Q=(C_{Q1},C_{Q2},\ldots,C_{Qk}\}$$

step 4.2: based on the Procrustes analysis algorithm, and by taking the pre-assembly point set $C_P$ as a reference, the pre-assembly point set $C_Q$ is aligned with the pre-assembly point set $C_P$ with an expression as follows:

$$C_Q = R_c \cdot C_P + T_c + E_c$$

an orthogonal rotation matrix $R_c$ under coarse matching, a rigid translation matrix $T_c$ under coarse matching, and an error matrix $E_c$ under coarse matching are computed;
a posture corresponding to the minimum distance between the two matching point sets, namely, the minimum error matrix $E_c$ under coarse matching is determined as a posture;

$\arg\min \|E_c\|$ based on the orthogonal rotation matrix $R_c$ under coarse matching and the rigid translation matrix $T_c$ under coarse matching, the denoised sliced point cloud $Q_3$ is adjusted to a sliced point cloud $Q_4$ after coarse matching with an expression as follows:

$$Q_4 = R_c \cdot Q_3 + T_c$$

to achieve coarse matching;

step 4.3: based on the iterative closest point algorithm, a point in the sliced point cloud $Q_4$ after coarse matching that is closest to each point in the sliced point cloud $P_3$ after denoising is found, and a variance of a distance between corresponding points is minimized via an orthogonal rotation matrix and a rigid translation matrix, that is:

$$\arg\min \| R_f \cdot Q_4 + T_f - P_3 \|^2$$

an orthogonal rotation matrix $R_f$ under fine matching and a rigid translation matrix $T_f$ under fine matching are computed;
based on the orthogonal rotation matrix $R_f$ under fine matching and the rigid translation matrix $T_f$ under fine matching, the sliced point cloud $Q_4$ after coarse matching is adjusted to a final assembly posture point cloud $Q_{final}$ with an expression as follows:

$$Q_{final} = R_f \cdot Q_4 + T_f$$

to achieve fine matching; and
for uniform description, the final assembly posture point cloud $P_{final}$ is defined as:

$P_{final} = P_3$ step 4.4: in an assembly plane, a distance f between each point in the final assembly posture point cloud $Q_{final}$ and its closest point in the final assembly posture point cloud $P_{final}$ is computed:

$$f = \| q_{fi} - p_{fi} \|$$

where $P_{fi}$ is an i-th point in the final assembly posture point cloud $P_{final}$ and $q_{fi}$ is an i-th point in the final assembly posture point cloud $Q_{final}$, thereby evaluating an assembly result.

Embodiment 1

Figure 6:
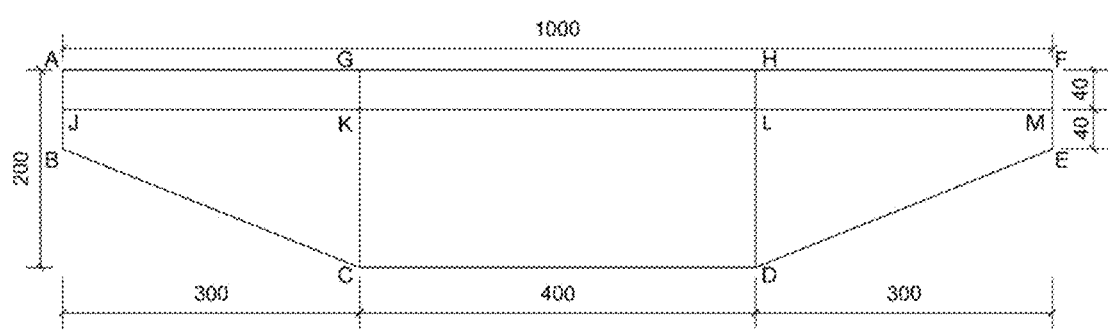
FIG. 6 is a cross-sectional dimension diagram of a simulated box girder for simulation verification according to the present invention.

As shown in FIG. 6: in a case computation, arithmetic programming is performed mainly based on MATLAB to obtain computation results.

Simulated precast beam segments under study are a pair of box girders (box girders 1 and 2) which are same in spatial geometric features and have an assembly relationship, where a beam length is 10 m, a beam width is 10 m, a beam height is 2 m, and a point cloud density is $1/cm^2$, and detailed dimensions are shown in FIG. 6. In order to simulate the method for virtual pre-assembly matching of prefabricated beams based on design-measured point cloud models, three environmental noises and four spatial geometric imperfections are preset on the box girder 1, and a 3D offset matrix is preset on the box girder 2.

Preset geometric imperfection 1: point J is moved to the right by 0.05 m; preset geometric imperfection 2: point D is moved up by 0.05 m; preset geometric imperfection 3: point L is moved to the left by 0.05 m; and preset geometric imperfection 4: edge EF is fully moved to the left by 0.05 m.
Preset 3D Offset Matrix:

$$R_x = \begin{bmatrix} 1 & 0 & 0 \\ 0 & 1 & 0.0015 \\ 0 & -0.0015 & 1 \end{bmatrix}, R_y = \begin{bmatrix} 1 & 0 & -0.0042 \\ 0 & 1 & 0 \\ 0.0042 & 0 & 1 \end{bmatrix},$$

$$R_z = \begin{bmatrix} 1 & 0.0029 & 0 \\ -0.0029 & 1 & 0 \\ 0 & 0 & 1 \end{bmatrix}, T = \begin{bmatrix} -1 \\ 0 \\ 2.1 \end{bmatrix}$$

1. According to step 1.1, oriented bounding boxes of a simulated box girder 1 and a simulated box girder 2 are computed respectively, such that the X-axis, Y-axis and Z-axis directions of a 3D coordinate system are parallel to the beam width, beam length and beam height directions of a component respectively; according to step 1.2, point cloud slices (a sliced point cloud 1 and a sliced point cloud 2) with a thickness of 0.02 m are made at an assembly interface of the simulated box girder 1 and the simulated box girder 2 respectively; and according to step 1.3, design point cloud D is generated.

2. According to step 2.1, centroids of the sliced point cloud 1, the sliced point cloud 2 and the design point cloud D are respectively moved to an origin of coordinates respectively; according to step 2.2, by taking the design point cloud as a reference, the sliced point cloud 1 with preset environmental noises is registered with the design point cloud based on the iterative closest point algorithm; and according to step 2.3, a distance threshold is set to 0.02 m for noise filtering, so that three environmental noises are well filtered.

3. According to step 3.1, outer boundaries of the sliced point cloud 1 and the sliced point cloud 2 are extracted respectively, the sliced point cloud 1 and the sliced point cloud 2 are partitioned respectively based on a coordinate range, boundaries are fitted by the RANSAC algorithm, and by taking intersection points of two adjacent boundaries as corners, corners A1, B1, C1, D1, E1, F1, A2, B2, C2, D2, E2, and F2 are extracted respectively.

4. According to step 4.1, based on the extracted corners of the sliced point cloud 1 and the sliced point cloud 2, a pre-assembly point set 1 and a pre-assembly point set 2 are formed;

according to step 4.2, based on the Procrustes analysis algorithm, by taking the pre-assembly point set 1 as a reference, the pre-assembly point set 2 is aligned with the pre-assembly point set 1 to obtain a rotation matrix and a translation matrix corresponding to coarse matching:

$$Rc_x = \begin{bmatrix} 1 & 0 & 0 \\ 0 & 1 & 0.0015 \\ 0 & -0.0015 & 1 \end{bmatrix}, Rc_y = \begin{bmatrix} 1 & 0 & -0.0042 \\ 0 & 1 & 0 \\ 0.0042 & 0 & 1 \end{bmatrix},$$

$$Rc_z = \begin{bmatrix} 1 & 0.0031 & 0 \\ -0.0031 & 1 & 0 \\ 0 & 0 & 1 \end{bmatrix}, Tc = \begin{bmatrix} -1 \\ 0 \\ 2.1 \end{bmatrix}$$

so as to obtain the sliced point cloud 2 under coarse matching;

according to step 4.3, based on the iterative closest point algorithm, a point in the sliced point cloud 1 after coarse matching that is closest to each point in the sliced point cloud 2 is found to obtain a rotation matrix and a translation matrix corresponding to fine matching:

$$Rf_x = \begin{bmatrix} 1 & 0 & 0 \\ 0 & 1 & 0 \\ 0 & 0 & 1 \end{bmatrix}, Rf_y = \begin{bmatrix} 1 & 0 & 0 \\ 0 & 1 & 0 \\ 0 & 0 & 1 \end{bmatrix},$$

$$Rf_z = \begin{bmatrix} 1 & 0.0002 & 0 \\ -0.0002 & 1 & 0 \\ 0 & 0 & 1 \end{bmatrix}, Tf = \begin{bmatrix} 0 \\ 0 \\ 0 \end{bmatrix}$$

which are consistent with the preset 3D offset matrix; according to the rotation matrices and the translation matrices corresponding to the coarse matching and the fine matching, the sliced point cloud 2 is adjusted to be in an assembly posture; and according to step 4.4, a distance between each point in the sliced point cloud 2 and its closest point in the sliced point cloud 1 is computed. It is computed that at the assembly interface, for the box girder 1: point D has an upward offset of 0.049 m, point J has a rightward offset of 0.052 m, edge EF has a leftward offset of 0.05 m, and point L has a leftward offset of 0.047 m, which are consistent with the preset geometric imperfections.

The above description is merely a preferred embodiment of the present invention, but the scope of protection of the present invention is not limited thereto. Any changes or substitutions that can be easily conceived by those skilled in the art within the technical scope disclosed by the present invention should fall within the scope of protection of the present invention. Hence, the scope of protection of the present disclosure shall be subject to the appended claims.

What is claimed is:

1. A method for virtual pre-assembly matching of prefabricated beams based on design-measured point cloud models, comprising the following steps:

step (1): computing an oriented bounding box respectively for 3D point clouds of two prefabricated beams with assembly relationship therebetween, and implementing 3D coordinate calibration based on geometric features of the 3D point clouds of the two prefabricated beams; for the calibrated 3D point clouds of the two prefabricated beams, making two point cloud slices at an assembly interface of the two prefabricated beams respectively; and based on an assembly interface jointly contained in the two point cloud slices, generating a discrete design point cloud for design information contained in the assembly interface;

step (2): registering the point cloud slices at the assembly interface of the two prefabricated beams in step (1) with the generated design point cloud respectively by an iterative closest point algorithm; and setting a distance threshold on the basis of a coordinate range of the design point cloud to denoise the two point cloud slices at the assembly interface;

step (3): based on the coordinate range of the design point cloud in step (2), partitioning the two denoised point cloud slices; and selecting a fitting function and a fitting algorithm according to features required to be fitted, to fit and extract boundary features and corner features of an assembly interface of two components to be assembled; and step (4): based on the fitted boundary features and corner features of the pre-assembly interface of the two components to be assembled in step (3), implementing coarse matching of the assembly interface by a Procrustes analysis algorithm firstly, and then implementing fine matching of the assembly interface by the iterative closest point algorithm, adjusting the 3D point cloud to be in a final assembly posture, computing a matching degree error of the assembly interface, and evaluating an assembly result.

2. The method for virtual pre-assembly matching of prefabricated beams based on design-measured point cloud models according to claim 1, wherein step (1) comprises the following specific sub-steps:

step 1.1: computing an oriented bounding box respectively for 3D point clouds of two prefabricated beams with assembly relationship therebetween, such that X-axis, Y-axis and z-axis directions of a 3D coordinate system are respectively parallel to a beam width, beam length and beam height directions of a component, thereby achieving coordinate calibration;

step 1.2: for features of an assembly interface of the two prefabricated beams, making point cloud slices (i.e., a sliced point cloud $P_1$ and a sliced point cloud $Q_1$) parallel to a XOZ coordinate plane respectively at an assembly interface of the two 3D point clouds subjected to coordinate calibration; where a thickness of a slice is twice a density of a measured point cloud; and the expression is as follows:

$$P_1 = \{p_1, p_2, \ldots, p_m\}, Q_1 = \{q_1, q_2, \ldots, q_n\}$$

step 1.3: generating a discrete design point cloud D based on design information and design drawings of an assembly interface jointly contained in the sliced point cloud $P_1$ and the sliced point cloud $Q_1$, where the expression is as follows:

$$D = \{d_1, d_2, \ldots, d_j\}.$$

3. The method for virtual pre-assembly matching of prefabricated beams based on design-measured point cloud models according to claim 2, wherein in step (2), by taking the design point cloud D as a reference, the sliced point cloud $P_1$ and the sliced point cloud $Q_1$ are respectively registered with the design point cloud D based on the iterative closest point algorithm through a registration method as follows:

step 2.1: moving centroids of the sliced point cloud $P_1$, the sliced point cloud $Q_1$ and the design point cloud D respectively to an origin of coordinates, that is:

$$P_c = P_1 - \overline{P}_1, Q_c = Q_1 - \overline{Q}_1, D_c = D - \overline{D}$$

where $P_c$ is a moved sliced point cloud $P_1$, and $\overline{P}_1$ is an average value of coordinates of the sliced point cloud $P_1$;

$Q_c$ is a moved sliced point cloud $Q_1$, and $\overline{Q}_1$ is an average value of coordinates of the sliced point cloud $Q_1$; and $D_c$ is a moved design point cloud D, and $\overline{D}$ is an average value of coordinates of the design point cloud D;

step 2.2: in the moved design point cloud $D_c$, finding points closest to each point in the moved sliced point cloud $P_c$ and the moved sliced point cloud $Q_c$ respectively, and minimizing a variance of a distance between corresponding points via an orthogonal rotation matrix and a rigid translation matrix, that is:

$$\operatorname{argmin}(f(p)) = \frac{1}{m}\sum_{i=1}^{m}\|R_p \cdot p_i + T_p - d_i\|^2$$

$$\operatorname{argmin}(f(q)) = \frac{1}{n}\sum_{j=1}^{n}\|R_q \cdot q_i + T_q - d_i\|^2$$

where m is a number of points of the moved sliced point cloud $P_c$, n is the number of points of the moved sliced point cloud $Q_c$, and $p_i$ is an i-th point in the moved sliced point cloud $P_c$, $q_i$ is an i-th point in the moved sliced point cloud $Q_c$, and $d_i$ is an i-th point in the moved design point cloud $D_c$;

computing an orthogonal rotation matrix $R_p$ and a rigid translation matrix $T_p$ based on the above equation when the moved sliced point cloud $P_c$ is registered with the moved design point cloud $D_c$;

computing an orthogonal rotation matrix $R_q$ and a rigid translation matrix $T_q$ based on the above equation when the moved sliced point cloud $Q_c$ is registered with the moved design point cloud $D_c$; and obtaining a sliced point cloud $P_2$ and a sliced point cloud $Q_2$ after registration with an expression as follows:

$$P_2 = R_p \cdot P_c + T_p$$
$$Q_2 = R_q \cdot Q_c + T_q$$

step 2.3: based on the coordinates of the design point cloud D, setting a distance threshold, screening valid point clouds, regarding points beyond a coordinate range in point clouds $P_2$ and $Q_2$ as invalid points and removing them to obtain a denoised sliced point cloud $P_3$ and a denoised sliced point cloud $Q_3$.

4. The method for virtual pre-assembly matching of prefabricated beams based on design-measured point cloud models according to claim 3, wherein step (3) comprises the following specific sub-steps:

step 3.1: based on the coordinates of the design point cloud $D_c$, partitioning the denoised sliced point cloud $P_3$ and the denoised sliced point cloud $Q_3$, and extracting boundary features and corner features respectively; and step 3.2: for the boundary features, directly fitting using a fitting function or a fitting algorithm; and for the corner features, fitting the boundary features firstly and then computing intersection points by intersecting the boundary features, and when a point corresponding to a corner feature obtained by fitting cannot be found in a measured point cloud, selecting a closest point as the corner feature by a nearest neighbor search method.

5. The method for virtual pre-assembly matching of prefabricated beams based on design-measured point cloud models according to claim 4, wherein in step (4), computing a matching degree error of the interface and evaluating an assembly result are specifically implemented as follows:

step 4.1: based on 3D coordinate information of the corner features extracted from the denoised sliced point cloud $P_3$ and the denoised sliced point cloud $Q_3$, establishing a pre-assembly point set $C_p$ and a pre-assembly point set $C_Q$, where both $C_p$ and $C_Q$ are k*3 matrices, and k is a number of matching points;

$$C_p = \{C_{p1}, C_{p2}, \ldots, C_{pk}\}, C_Q = \{C_{Q1}, C_{Q2}, \ldots, C_{Qk}\}$$

Step 4.2: based on the Procrustes analysis algorithm, and by taking the pre-assembly point set $C_p$ as a reference, aligning the pre-assembly point set $C_Q$ with the pre-assembly point set $C_p$, where the expression is as follows:

$$C_Q = R_c \cdot C_P + T_c + E_c$$

computing an orthogonal rotation matrix $R_c$ under coarse matching based on the above equation;

computing a rigid translation matrix $T_c$ under coarse matching based on the above equation;

computing an error matrix $E_c$ under coarse matching based on the above equation;

determining a posture corresponding to a minimum distance between two matching point sets, namely, determining a posture when the error matrix $E_c$ is minimum under coarse matching as a posture after coarse matching;

$$\operatorname{argmin}\|E_c\|$$

based on the orthogonal rotation matrix $R_c$ under coarse matching and the rigid translation matrix $T_c$ under coarse matching, adjusting the denoised sliced point cloud $Q_3$ to a sliced point cloud $Q_4$ after coarse matching with an expression as follows:

$$Q_4 = R_c \cdot Q_3 + T_c$$

to achieve coarse matching; and step 4.3: based on the iterative closest point algorithm, in the sliced point cloud $Q_4$ after coarse matching, finding a point in the sliced point cloud $Q_4$ after coarse matching that is closest to each point in the sliced point cloud $P_3$ after denoising, and minimizing a variance of a distance between corresponding points via an orthogonal rotation matrix and a rigid translation matrix, that is:

$$\arg\min\|R_f \cdot Q_4 + T_f - P_3\|^2$$

computing an orthogonal rotation matrix $R_f$ under fine matching based on the above equation;

computing a rigid translation matrix $T_f$ under fine matching based on the above equation; based on the orthogonal rotation matrix $R_f$ under fine matching and the rigid translation matrix $T_f$ under fine matching, adjusting the sliced point cloud $Q_4$ after coarse matching to a final assembly posture point cloud $Q_{final}$ with an expression as follows:

$$Q_{final} = R_f \cdot Q_4 + T_f$$

to achieve fine matching; and for uniform description, defining a final assembly posture point cloud $P_{final}$ as:

$$P_{final} = P_3$$

step 4.4: in an assembly plane, computing a distance f between each point in the final assembly posture point cloud $Q_{final}$ and its closest point in the final assembly posture point cloud $P_{final}$:

$$f = \| q_{fi} - p_{fi} \|$$

where $P_{fi}$ is an i-th point in the final assembly posture point cloud $P_{final}$ and $q_{fi}$ is an i-th point in the final assembly posture point cloud $Q_{final}$, thereby evaluating an assembly result.

\* \* \* \* \*